United States Patent [19]

Main

[11] Patent Number: 4,831,337
[45] Date of Patent: May 16, 1989

[54] WIDEBAND AMPLIFIER

[75] Inventor: William E. Main, Mesa, Ariz.

[73] Assignee: Motorola, Inc, Schaumburg, Ill.

[21] Appl. No.: 185,640

[22] Filed: Apr. 25, 1988

[51] Int. Cl.[4] .............................................. H03F 3/04
[52] U.S. Cl. .................................... 330/288; 323/315
[58] Field of Search ................ 330/257, 288; 323/315, 323/316

[56] References Cited
FOREIGN PATENT DOCUMENTS
2086682 5/1982 United Kingdom ................ 330/288

Primary Examiner—Gene Wan
Attorney, Agent, or Firm—Michael D. Bingham

[57] ABSTRACT

An amplifier comprising a plurality of stacked current mirrors, each having an input and a common terminal, provides an output amplified current in response to receiving an input current at first and second inputs. A current source supplies a direct current to the input of the first one of the current mirrors while the input and the common terminal is also coupled to the first and second inputs of the amplifier. The common terminal of each preceding current mirror is coupled to the input of the next proceeding current mirror whereby the sum of the input and output currents of the preceding amplifier is sourced to the input of the proceeding current mirror. An output of the last one of the plurality of current mirrors is coupled to the output of the amplifier.

12 Claims, 2 Drawing Sheets

WIDEBAND AMPLIFIER

BACKGROUND OF THE INVENTION

The present invention relates to amplifiers and, more particularly, to high frequency wideband amplifiers suited to be manufactured in monolithic integrated circuit form.

The art is replete with high frequency amplifiers. Generally, most high frequency amplifiers have been fabricated using discrete components. Many of these prior art amplifiers require large component count, transformers and are expensive. In addition, such high frequency amplifiers require high power consumption and are not suited for use with battery operated power supplies.

Presently, there is a need for an integrated linear wideband amplifier the gain and phase of which are consistent and predictable and which can be operated from a battery voltage while providing relatively high output power and low current drain.

SUMMARY OF THE INVENTION

Accordingly, it is an object of the present invention to provide an improved amplifier.

It is another object of the present invention to provide an improved high frequency wideband suited to be manufactured in integrated circuit form.

Still another object of the present invention is to provide an integrated amplifier circuit which may be battery operated while having high output power and low current drain.

In accordance with the above and other objects there is provided an amplifier comprising at least first and second current mirrors each having an input, an output and a common terminal and a current source for supplying a current to the input of the first current mirror; the input and the common terminal of the first current mirror being coupled to inputs of the amplifier for receiving a differential input signal while the output is coupled to power supply conductor; the input of the second current mirror being coupled to the common terminal of the first current mirror, the output of the second current mirror being coupled to an output of the amplifier and the common terminal being coupled to a second power supply conductor.

DETAILED DESCRIPTION OF THE PREFERRED EMBODIMENT

Figure 1:
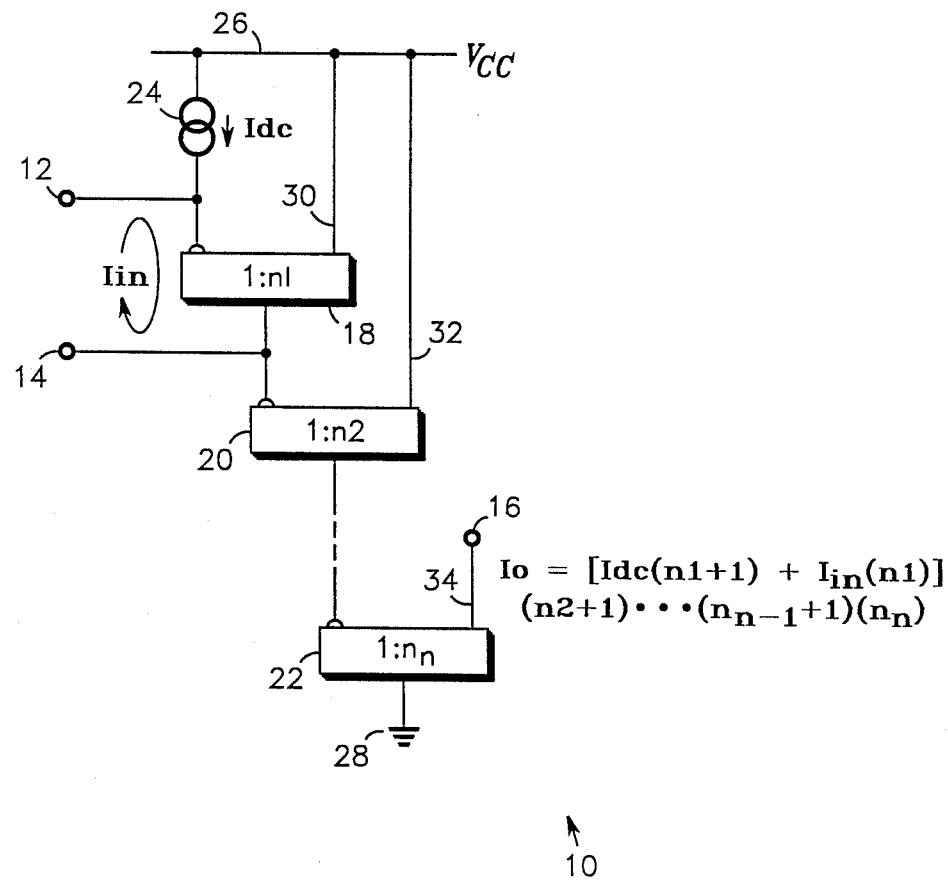
FIG. 1 is a partial block and schematic diagram of the amplifier of the present invention.

Turning to FIG. 1 there is shown wideband amplifier 10 of the present invention which is suited to be manufactured in integrated circuit form. Amplifier 10 is illustrated as comprising a plurality of current mirrors 18, 20 and 22 each having an input (shown by the semi-circle), an output and a common terminal. Although amplifier 10 is illustrated as having n current mirrors the novelty of the present invention is found in stacking first and second current mirrors in the manner to be described.

First current mirror 18 is shown as having its input and common terminal coupled to inputs 12 and 14 respectively to which is received a differential input current $I_{in}$. In addition, current source 24 supplies a direct current $I_{dc}$ to the input of current mirror 18. The output of current mirrors 18 and 20 (via leads 30 and 32), as well as current source 24, are coupled to a first power supply conductor to which is supplied $V_{cc}$. $V_{cc}$ may be a battery voltage. The common terminal of current mirror 18 is coupled to the input of current mirror 20 while the common terminal of the latter is coupled to the input of current mirror 22. As illustrated, a plurality of current mirrors may be stacked between the common terminal of current mirror 20 and the input of $n^{th}$ current mirror 22 with each having their common terminals coupled to the input of the next proceeding current mirror as illustrated by current mirrors 20 and 22. Current mirror 22, being the last stage of the stacked current mirror stages, has its common terminal coupled to a second power supply conductor 28 to which is supplied a ground reference potential. The output of current mirror 22 is coupled to output 16 of amplifier 10 via lead 34. Each of the current mirrors will provide a current at its output which is a multiple of the supplied input current. For example, the output current at lead 30 from current mirror 18 is equal to:

$$(I_{dc}+I_{in})(n1) \tag{1}$$

where n1 is the multiplication factor of current mirror 18, as is understood.

Thus, the input current supplied to the input of current mirror 20 from the common terminal of current mirror 18 can be shown to be equal to:

$$I_{dc}(n1+1)+I_{in}(n1) \tag{2}$$

Similarly, the output of current mirror 20 provided at lead 32 is equal to:

$$[I_{dc}(n1+1)+I_{in}](n2) \tag{3}$$

where n2 is the multiplication factor of current mirror 20.

Thus, the output current, Io, provided at output 16 may be shown to be equal to:

$$[I_{dc}(n1+1)+I_{in}(n1)](n2+1)\ldots(n_{n-1}+1)(n_n) \tag{4}$$

Figure 2:
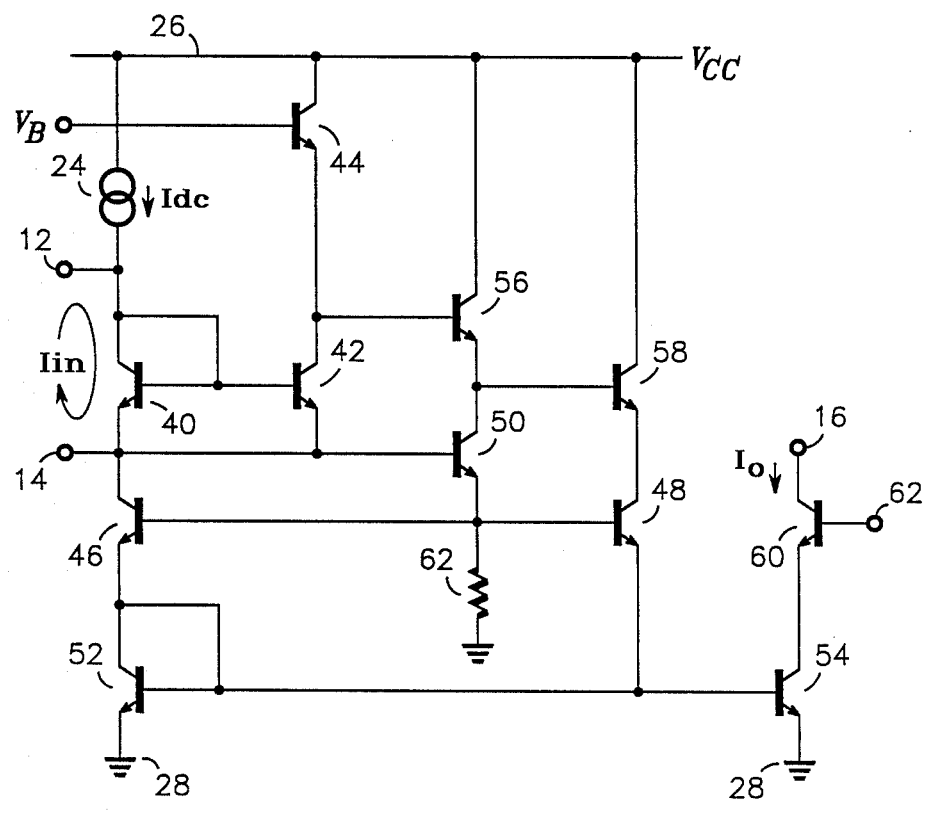
FIG. 2 is a schematic diagram illustrating the amplifier of the preferred embodiment.

Basically, then, the sum of the input and output currents of each preceding current mirror stage become the input current to the next following current mirror stage. Each preceding current mirror stage effectively presents a high output impedance current source to the following current mirror stage. Because the amplifier 10 is driven differentially, as is seen in FIG. 2, the input of current mirror 28 appears as a common emitter rather than as a common collector input to the driving source. This results in good matching between the input impedance of amplifier 10 and the driving source to the amplifier. As is evidence by the above equations, the stacked current mirrors 18 . . . 22 are utilized to build up the gain of amplifier 10.

Referring now to FIG. 2, a complete schematic of amplifier 10 is illustrated wherein like components thereof are designated by the same reference numbers used in FIG. 1. It is apparent to those skilled in the art that amplifier 10 is suited to be manufactured in integrated circuit form using conventional low power bipolar integrated circuit processes. In the present case, amplifier 10 is comprised of three current mirror stages (n=3) that are stacked in the manner shown in FIG. 1.

Relating back to the above, current mirror 18 is formed by diode connected transistor 40 and transistor 42 the connection therebetween being well known in the art. Transistor 40 functions as a semiconductor diode having its collector and base electrodes interconnected to the control or base electrode of transistor 42. The collector of transistor 40 acts as the input of the current mirror and is coupled both to input 12 and current source 24. The first or emitter electrodes of transistors 40 and 42 are interconnected at the common terminal of the current mirror while the collector or second electrode of transistor 42 (the output of the current mirror) is buffered via the collector-emitter conduction path of transistor 44 from power supply conductor 26, the base of the latter being coupled to a terminal at which a bias potential $V_B$ is provided. Transistors 46 and 48 function as the current mirror 20 with the collector of transistor 46 (the input of the current mirror) being coupled to the common terminal of the preceding current mirror). The bases of transistors 46 and 48 are interconnected with the emitter of transistor 50 and resistor 62. The collector of transistor 48 provides the output of the current mirror and is buffered from supply by cascoded transistors 44, 56 and 58. Similarly, transistor 50 which has its collector coupled to the emitter of transistor 56 and its base coupled to input 14 buffers current mirror 20 from voltage swings to effectively increase the frequency response of transistor 48. The third current mirror is illustrated as comprising diode connected transistor 52 and transistor 54 connected together in substantially the same manner as previously described in reference to first current mirror 18. Again, the output of the current mirror (the collector of transistor 54 is buffered from the output 16 of amplifier 10 by cascoded transistor 60 which can be switched on or off by an appropriate signal applied at terminal 62. Although amplifier 10 has been described above as having output 16 coupled to the collector of transistor 54 of current mirror 22, it is to be understood that an output of amplifier 10 can be taken from the common terminal of the aforementioned current mirror instead of the latter being coupled to conductor 28.

Hence, what has been shown and described is a novel amplifier utilizing stacked current mirrors for amplifying a differentially applied input current. The sum of the input and output currents of each preceding stacked current mirrors provides the input current source to the input of the next proceeding stacked current mirror.

What is claimed is:

1. An amplifier, comprising:
   first and second power supply conductors;
   a plurality of current mirrors each having an input, an output and a common terminal wherein the common terminal of each preceding current mirror is coupled to the input of the next proceeding current mirror, said output of the last one of said plurality of current mirrors being coupled to an output of the amplifier, said common terminal of said last current mirror being coupled to said second power supply conductor;
   current source means coupled between said first power supply conductor and said input of the first one of said plurality of current mirrors for supplying a substantially constant current thereto; and
   means for coupling said input and common terminal of said first current mirror to first and second inputs of the amplifier.

2. The amplifier of claim 1 wherein said plurality of current mirrors includes said first, said last and a second current mirror, said input of said second current mirror being coupled to said common terminal of said first current mirror and said common terminal of said second current mirror being coupled to said input of said last current mirror, said outputs of said first and second current mirrors being coupled to said first power supply conductors.

3. The amplifier of claim 1 wherein said first current mirror includes:
   first semiconductor diode means coupled between said input and said common terminal; and
   a first transistor having first, second and control electrodes, said first electrode being coupled to said common terminal, said second terminal being coupled to said output and said control electrode being coupled to said input.

4. The amplifier of claim 1 wherein said last current mirror includes:
   a first semiconductor diode means coupled between said input and said common terminal; and
   a first transistor having first, second and control electrodes, said first electrode being coupled to said common terminal, said second terminal being coupled to said output and said control electrode being coupled to said input.

5. The amplifier of claim 2 wherein said second current mirror includes:
   a first transistor having first, second and control electrodes, said second electrode being coupled to said input thereof;
   means for coupling said second electrode of said first transistor to said control electrode; and
   a second transistor having first, second and control electrodes, said first electrodes of said first and second transistors being coupled to said common terminal thereof, said control electrode being coupled to said control electrode of said first transistor and said second electrode being coupled to said output thereof.

6. The amplifier of claim 3 wherein said second current mirror includes:
   a second transistor having first, second and control electrodes, said second electrode being coupled to said input thereof;
   means for coupling said second electrode of said second transistor to said control electrode thereof; and
   a third transistor having first, second and control electrodes, said first electrodes of said second and third transistors being coupled to said common terminal thereof, said control electrode being coupled to said control electrode of said second transistor and said second electrode being coupled to said output thereof.

7. The amplifier of claim 6 wherein said last current mirror includes:
   a second semiconductor diode means coupled between said input and said common terminal; and
   a fourth transistor having first, second and control electrodes, said first electrode being coupled to said common terminal, said second terminal being coupled to said output and said control electrode being coupled to said input.

8. An integrated amplifier circuit responsive to an input signal supplied at first and second inputs for providing an output signal at an output, comprising:

a plurality of current mirrors each having an input and a common terminal wherein said common terminal of each preceding current mirror is coupled to said input of the next proceeding current mirror such that the sum of the input and output currents of a preceding current mirror is supplied to said input of said proceeding current mirror;

means for coupling said input and common terminal of a first one of said plurality of current mirrors to the first and second inputs of the amplifier;

means for coupling an output of the last one of said plurality of current mirrors to the output of the amplifier; and current source means for supplying a direct current to said input of said first current mirror.

9. The amplifier of claim 8 wherein said plurality of current mirrors comprises said first, said last and an additional current mirror, said input and common terminal of said additional current mirror being coupled respectively to said common terminal of said first current mirror and said input of said last current mirror and said common terminal of said last current mirror being coupled to a terminal at which is supplied a ground reference potential.

10. An amplifier, comprising:

a plurality of current mirrors each having first, second and common terminals wherein a current is provided at said common terminal having a magnitude equal to the sum of the currents appearing at said first and second terminals and said common terminal of each preceding current mirror being coupled to said first terminal of the next proceeding current mirror;

current source means for supplying a substantially constant current to the first terminal of the first one of said plurality of current mirrors; and means for coupling said first and common terminals of said first current mirror to first and second inputs respectively of the amplifier.

11. The amplifier of claim 10 wherein said second terminal of the last one of said plurality of current mirrors is coupled to an output of the amplifier and said common terminal is coupled to a terminal to which is supplied a ground reference potential.

12. The amoplifier of claim 10 wherein said common terminal of the last one of said plurality of current mirrors is coupled to an output of the amplifier and said second terminal is coupled to a terminal to which is supplied an operating potential.

* * * * *